(12) United States Patent
Kawase

(10) Patent No.: US 8,553,312 B2
(45) Date of Patent: Oct. 8, 2013

(54) ELECTRONIC DEVICE, ORGANIC ELECTROLUMINESCENCE DEVICE, AND ORGANIC THIN FILM SEMICONDUCTOR DEVICE

(75) Inventor: Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 821 days.

(21) Appl. No.: 11/844,015

(22) Filed: Aug. 23, 2007

(65) Prior Publication Data
US 2008/0106191 A1 May 8, 2008

(30) Foreign Application Priority Data
Sep. 27, 2006 (JP) ................................. 2006-261997

(51) Int. Cl.
*G02B 26/00* (2006.01)
*G09G 3/34* (2006.01)

(52) U.S. Cl.
USPC .......................................... 359/296; 345/107

(58) Field of Classification Search
USPC ................. 313/498–512; 204/242; 345/107; 359/296; 205/629
See application file for complete search history.

(56) References Cited

U.S. PATENT DOCUMENTS

| | | | | | |
|---|---|---|---|---|---|
| 5,540,999 | A | * | 7/1996 | Yamamoto et al. | 428/411.1 |
| 5,618,392 | A | * | 4/1997 | Furuya | 204/252 |
| 5,703,436 | A | * | 12/1997 | Forrest et al. | 313/506 |
| 6,198,217 | B1 | * | 3/2001 | Suzuki et al. | 313/504 |
| 6,337,492 | B1 | * | 1/2002 | Jones et al. | 257/40 |
| 6,635,988 | B1 | | 10/2003 | Izumizawa et al. | |
| 6,656,609 | B2 | | 12/2003 | Takahashi et al. | |
| 6,685,806 | B1 | | 2/2004 | Cadaval Fernandez De Leceta et al. | |
| 2002/0125817 | A1 | * | 9/2002 | Yamazaki et al. | 313/498 |
| 2002/0180347 | A1 | * | 12/2002 | Adachi et al. | 313/503 |
| 2002/0185967 | A1 | * | 12/2002 | Friend | 313/504 |
| 2003/0137242 | A1 | * | 7/2003 | Seki | 313/506 |
| 2003/0151355 | A1 | * | 8/2003 | Hosokawa | 313/504 |
| 2004/0046496 | A1 | * | 3/2004 | Mishima | 313/504 |
| 2004/0051444 | A1 | * | 3/2004 | Schaepkens et al. | 313/504 |
| 2004/0119399 | A1 | * | 6/2004 | Nagayama | 313/500 |
| 2004/0157167 | A1 | * | 8/2004 | Morii | 430/321 |
| 2004/0169467 | A1 | * | 9/2004 | Sugimoto et al. | 313/512 |
| 2005/0008893 | A1 | * | 1/2005 | Kato | 428/690 |
| 2005/0057136 | A1 | * | 3/2005 | Moriya et al. | 313/311 |
| 2005/0237279 | A1 | * | 10/2005 | Chen et al. | 345/76 |
| 2005/0269568 | A1 | * | 12/2005 | Koo et al. | 257/59 |
| 2006/0102896 | A1 | | 5/2006 | Suh et al. | |
| 2006/0113549 | A1 | | 6/2006 | Den et al. | |
| 2007/0057932 | A1 | * | 3/2007 | Shin et al. | 345/204 |
| 2008/0238828 | A1 | * | 10/2008 | Nakayama et al. | 345/76 |

FOREIGN PATENT DOCUMENTS

| | | |
|---|---|---|
| JP | A-62-127789 | 6/1987 |
| JP | B-2686169 | 8/1997 |
| JP | A-2000-208252 | 7/2000 |

(Continued)

*Primary Examiner* — Nimeshkumar Patel
*Assistant Examiner* — Steven Horikoshi
(74) *Attorney, Agent, or Firm* — Oliff & Berridge, PLC

(57) ABSTRACT

An electronic device includes a substrate, a functional element formed on the substrate, an electrolytic element provided on at least one of a side of the substrate on which the functional element is formed and a side of the substrate opposite to the side on which the functional element is formed, configured including a solid-state electrolyte layer and a pair of electrodes for holding the solid-state electrolyte layer in between, and capable of applying electrolysis to water, and a sealing member for sealing the functional element and the electrolytic element.

12 Claims, 3 Drawing Sheets

(56) References Cited

FOREIGN PATENT DOCUMENTS

| | | |
|---|---|---|
| JP | A-2000-294369 | 10/2000 |
| JP | A-2002-033187 | 1/2002 |
| JP | A-2002-533877 | 10/2002 |
| JP | A-2006-148054 | 6/2006 |
| JP | A-2006-186319 | 7/2006 |
| WO | WO 2005088594 A1 * | 9/2005 |

* cited by examiner

ELECTRONIC DEVICE, ORGANIC ELECTROLUMINESCENCE DEVICE, AND ORGANIC THIN FILM SEMICONDUCTOR DEVICE

The entire disclosure of Japanese Patent Application No. 2006-261997, filed Sep. 27, 2006 is expressly incorporated by reference herein.

BACKGROUND OF THE INVENTION

1. Technical Field

The present invention relates to an electronic device, an organic electroluminescence device, and an organic thin film semiconductor device, and in particular to a sealing technology for an electronic device equipped with an organic semiconductor element, an oxide semiconductor element, or an organic electroluminescence element.

2. Related Art

In recent years, portable equipment such as a mobile phone or a PDA, or a personal computer using a low profile display such as an organic electroluminescence (hereinafter also referred to simply as EL) display device or an electrophoretic display device as a display section thereof has been developed. An organic EL display device is provided with a number of light emitting elements on the surface of the substrate, and performs desired display by independently controlling driving of each of the light emitting elements. Further, it has been considered to form an electrophoretic display device by combining an active matrix substrate provided with organic thin film transistors (hereinafter abbreviated as TFT) with, for example, electrophoretic elements. As described above, organic EL elements and organic TFT are thought to be promising as devices for displays, and in particular, since devices using organic materials can be formed at relatively low temperature, plastic substrate can be used therefor, thus possibilities as flexible elements are expected.

However, such organic devices have had a significant problem regarding reliability. In the case with an organic EL display device, for example, it is well known that the light emitting sections described above are deteriorated by oxygen and moisture, and accordingly, a highly airtight structure capable of preventing penetration of oxygen and moisture has been required. Further, it is required riot only to prevent oxygen and moisture from penetrating for the outside but also to encapsulate a getter agent (e.g., a desiccating agent or an oxygen absorbing agent) for capturing a small amount of oxygen and moisture penetrating therein. In other words, the sealing structure alone is not sufficient for improving the reliability, and without any means for capturing the penetrating harmful components, the effects of providing the sealing structure do not last long. An example of an organic EL display device having a getter agent inside the space hermetically sealed by a sealing substrate is disclosed in, for example, JP-A-2000-208252 and Japanese Patent No. 2,686,169.

Further, regarding an organic TFT, there have been some cases in which, although they have operated stably in vacuum or in an inert gas atmosphere, the characteristics thereof have been deteriorated when they have been exposed to the atmosphere including oxygen and moisture. Therefore, as is the case with organic EL display devices, the sealing structure and the capturing means for the harmful components have been required.

As described above, organic EL elements and organic TFT are preferable for manufacturing flexible elements taking an advantage that they can be manufactured at relatively low temperature. However, the problem of reliability arises here again. In other words, if a glass substrate is used as the substrate of the device side, glass or metal can also be used as the material for the sealing structure (a substrate for sealing). In this case, highly airtight sealing structure can be realized. On the contrary, in the case in which a plastic substrate is used as the substrate of the device side, if glass or metal is used as the material of the sealing structure, flexible devices can hardly be realized, and accordingly, the use of the plastic substrate becomes meaningless. Therefore, although in this case, plastic is inevitably used in the sealing structure side, it is quite difficult to realize such a highly airtight sealing structure with plastic material. Specifically, although it has been proposed to seal an organic device with a resin film, an inorganic film, or a multilayered structure thereof, the gas permeabilities of these materials are significantly large in comparison with those of the glass and metal, and accordingly sealing might be insufficient. Further, if the capturing means such as a getter agent is provided, it reaches its capture limit in a relatively short period of time, thus making its practical application difficult.

SUMMARY

In consideration of the above problem, an aspect of the invention has an advantage of providing an electronic device, an organic electroluminescence device, and an organic thin film semiconductor device capable of assuring sufficient reliability even in the case in which the sealing structure is formed of a material having relatively high gas-permeability such as an organic material.

An electronic device according to an aspect of the invention includes a substrate, a functional element formed on the substrate, an electrolytic element provided on at least one of a side of the substrate on which the functional element is formed and a side of the substrate opposite to the side on which the functional element is formed, configured including a solid-state electrolyte layer and a pair of electrodes for holding the solid-state electrolyte layer in between, and capable of applying electrolysis to water and a sealing member for sealing the functional element and the electrolytic element. Further, what includes an organic material layer can be used as the functional element. Alternatively, what includes an oxide semiconductor layer can also be used as the functional element.

The inventors of the present invention conducted measurements of variations in the performances of various kinds of functional elements while controlling the environment and found, as a result of the measurements, the most problematical gas in the gas components included in the atmosphere is water (moisture). At the first stage, although it was thought that the influence of oxygen was as great as that of moisture, it has tuned out that the deterioration of performance is actually remarkable when the element is exposed to the atmosphere including moisture. On the other hand, some elements were not at all deteriorated in the oxygen atmosphere depending on the structure of the element or the composing material. Therefore, the inventors regarded the moisture in the atmosphere as the most harmful factor, and have reached the invention relating to the configuration for converting the moisture penetrating the inside of the device into oxygen and hydrogen by electrolysis.

According to the configuration of the electronic device of an aspect of the invention, since the electrolytic element composed of the solid-state electrolyte layer and the pair of electrodes is encapsulated inside the sealing member, even if water penetrates the inside of the sealing member, the water is decomposed by the electrolytic element and converted into oxygen and hydrogen. By this action, the functional element positioned adjacent to the electrolytic element can be prevented from the deterioration of performance caused by moisture, thus an electronic device superior in reliability can be realized.

Further, the configuration in which the functional element and the electrolytic element are stacked on the same side of the substrate can be adopted.

Although the functional element and the electrolytic element can be arranged in parallel to each other on one side of the substrate, the configuration of stacking the functional element and the electrolytic element can achieve downsizing of the organic electronic device while improving the reliability.

Further, in the configuration described above, it is preferable that out of the pair of electrodes forming the electrolytic element, a cathode is disposed facing to the functional element side, and an anode is disposed facing to an opposite side to the functional element side.

In the electrolysis of water the following reaction is caused in the cathode.

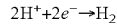
$$2H^+ + 2e^- \rightarrow H_2$$

Meanwhile, the following reaction is caused in the anode.

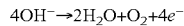
$$4OH^- \rightarrow 2H_2O + O_2 + 4e^-$$

Although the hydrogen gas is not harmful to the functional element, the oxygen gas can be a cause for deteriorating the functional element. Therefore, by disposing the cathode facing to the functional element side while disposing the anode facing to the opposite side to the functional element, the deterioration in the performance of the functional element caused by the oxygen can be prevented.

Further, in the configuration described above, it is preferable that the anode is provided with a gas-permeable hole.

According to the present configuration, since the oxygen gas generated in the boundary surface between the solid-state electrolyte layer and the anode is gradually discharged to the outside via the gas-permeable hole, the density of the oxygen never exceeds a predetermined value, thus the effect of preventing the deterioration of the element performance caused by oxygen can be maintained.

Further, both of the substrate and the sealing member are preferably formed of a resin material.

Since resin materials generally have a certain level of gas permeability, particularly in the case in which the sealing member is formed of a resin material, the atmospheric air penetrates the inside of the sealing member. However, since in the configuration of this aspect of the invention, the electrolytic element is provided inside the sealing member, as described above, the deterioration of the performance of the functional element caused by moisture can be prevented. In addition to the above, in the case in which the substrate and the sealing member are both formed of a resin material, a flexible electronic device can be realized, which is preferably applied to, for example, portable equipment.

Further, the solid-state electrolyte layer is preferably formed of a polymeric electrolyte material.

As the polymeric electrolyte material, for example, ion-exchange resin can be used, which can easily be obtained, thus the polymeric electrolyte material can be realized at low cost.

In particular, if the polymeric electrolyte material includes a sulfonic acid group, the electrolytic performance is enhanced by the increased polarization, and further, in the case in which at least a part of hydrogen composing the polymeric electrolyte material is substituted by fluorine, further large polarization and strong hydrophobicity can be obtained.

Further, the material of the pair of electrodes forming the electrolytic element preferably includes platinum or palladium.

According to this configuration, since the platinum and palladium as the electrode material have catalytic influences, the electrolytic reaction rate becomes higher more effectively.

Further, an organic EL device according to another aspect of the invention includes a substrate, an organic EL element including an organic material layer formed on the substrate, an electrolytic element provided on at least one of a side of the substrate on which the organic EL element is formed and a side of the substrate opposite to the side on which the organic EL element is formed, configured including a solid-state electrolyte layer and a pair of electrodes for holding the solid-state electrolyte layer in between, and capable of applying electrolysis to water, and a sealing member for sealing the organic EL element and the electrolytic element.

According to the configuration of the organic EL device of this aspect of the invention, since the electrolytic element composed of the solid-state electrolyte layer and the pair of electrodes is encapsulated inside the sealing member, even if water enters into the inside of the sealing member, the water is decomposed by the electrolytic element and converted into oxygen and hydrogen. By this action, the organic EL element positioned adjacent to the electrolytic element can be prevented from the deterioration of performance caused by moisture, thus an organic EL device superior in reliability can be realized.

Further, it is preferable to have a configuration that the organic EL element includes a transparent electrode and a reflective electrode disposed across the light emitting layer from each other, and the electrolytic element is stacked on the organic EL element on the side to which the reflective electrode is provided.

In the case in which the electrolytic element is stacked on the organic EL element on the side to which the reflective electrode is provided., it is arranged that the electrolytic element is positioned on the opposite side of the organic EL element to the side from which the light is emitted. In this case, since there is no need for the electrolytic element to have translucency, the freedom of selection of the composing material of the electrolytic element increases, thus manufacturability of the electrolytic element can be enhanced.

Further, according to still another aspect of the invention, there is provided an organic thin film semiconductor device including a substrate, an organic TFT including an organic material layer formed on the substrate, an electrolytic element provided on at least one of a side of the substrate on which the organic TFT is formed and a side of the substrate opposite to the side on which the organic TFT is formed, configured including a solid-state electrolyte layer and a pair of electrodes for holding the solid-state electrolyte layer in between, and capable of applying electrolysis to water, and a sealing member for sealing the organic TFT and the electrolytic element.

According to the configuration of the organic thin film semiconductor device of this aspect of the invention, since the electrolytic element composed of the solid-state electrolyte layer and the pair of electrodes is encapsulated inside the sealing member, even if water enters into the inside of the sealing member, the water is decomposed by the electrolytic element and converted into oxygen and hydrogen. By this action, the organic TFT positioned adjacent to the electrolytic element can be prevented from the deterioration of performance caused by moisture, thus an organic thin film semiconductor device superior in reliability can be realized.

Further, the configuration is preferably provided that the electrolytic element is disposed on the opposite side surface of the substrate to the side on which the organic TFT is provided.

In the case of the organic TFT, since the source, drain, and gate are formed on the surface of the substrate, steps must be caused on the substrate. Therefore, the electrolytic element can more easily be manufactured on the surface of the substrate on the opposite side to the side where the organic TFT is formed.

BRIEF DESCRIPTION OF THE DRAWINGS

The invention will now be described with reference to the accompanying drawings, wherein like numbers refer to like elements.

DESCRIPTION OF THE EMBODIMENTS

First Embodiment

Hereinafter, a first embodiment of the invention will be explained with reference to FIGS. 1 and 2.

An organic electronic device of the present embodiment is an example of an organic EL device having an electrolytic element stacked on an organic EL element as a functional element.

Figure 1:
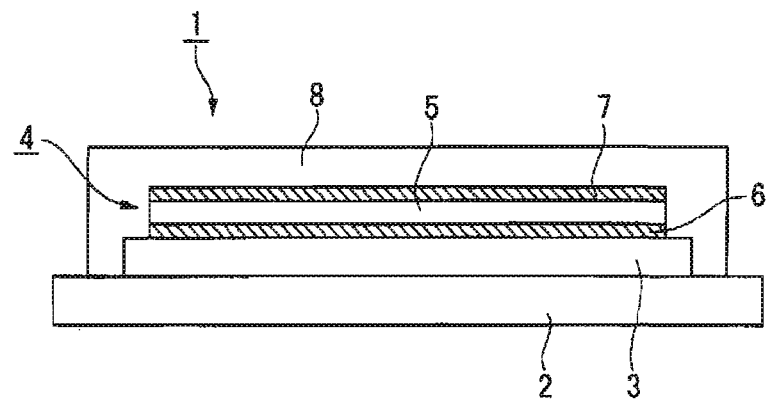
FIG. 1 is a cross-sectional view of an organic EL device (an electronic device) according to a first embodiment.
Figure 2:
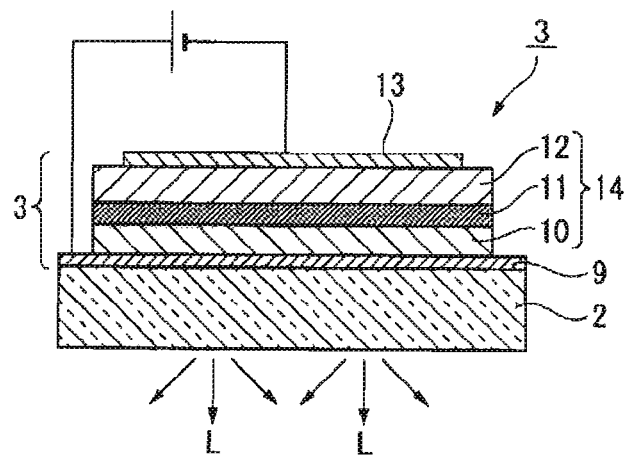
FIG. 2 is a cross-sectional view showing a detailed configuration of an organic EL substrate according to the same.

FIG. 1 is a cross-sectional view of the organic EL device according to the present embodiment, and FIG. 2 is an enlarged cross-sectional view showing a detailed configuration of an organic EL substrate. It should be noted that in all of the following drawings, the scale ratios of respective sizes and film thicknesses are set differently for every configuration element so that each of the configuration elements can be viewed easily.

As shown in FIG. 1, the organic EL device 1 according to the present embodiment provided with an organic EL element 3 formed on one surface of a glass substrate 2, and an electrolytic element 4 stacked on the organic EL element 3. The electrolytic element 4 is composed of a solid-state electrolyte layer 5, a cathode 6, and an anode 7, the cathode 6 and the anode 7 holding the solid-state electrolyte layer 5 therebetween, and is disposed so that the cathode 6 faces to the organic EL element 3 side and the anode 7 faces to the opposite side to the organic EL element 3. Further, the organic EL element 3 and the electrolytic element 4 are integrally sealed by a sealing layer 8 (sealing member) formed on the one surface side of the glass layer 2.

As shown in FIG. 2, the organic EL element 3 has a configuration including a pixel electrode 9 (anode), a hole injection layer 10, a light emitting layer 11, an electron transport layer 12, and a common electrode 13 (cathode) stacked sequentially on the glass substrate 2. The hole injection layer 10, the light emitting layer, and the electron transport layer 12 are each formed of an organic material, and an organic functional layer 14 is formed by these organic layers. In other words, the organic functional layer 14 is held between the pixel electrode 9 and the common electrode 13, and the organic EL element 3 is formed of the pixel electrode 9, the organic functional layer 14, and the common electrode 13. In the configuration, when a voltage is applied between the pixel electrode 9 and the common electrode 13, the electrons injected from the common electrode 13 and the holes injected from the pixel electrode 9 are recombined in the light emitting layer 11, and the energy emitted in the recombination is emitted in the form of fluorescence or phosphorescence. The light L emitted from the organic EL element 3 is emitted from the glass substrate 2 to the outside (a bottom emission type). Therefore, in the present embodiment the common electrode 13 functions as a reflective electrode, and the isotropically emitted light is emitted towards the side of the glass substrate 2.

The pixel electrode 9 is made of indium tin oxide (hereinafter abbreviated as ITO). Although omitted from the drawings here, the pixel electrode 9 is driven by an active matrix circuit via a TFT. Further, the hole injection layer 10 is formed of an organic material such as arylamine derivatives, phthalocyanine derivatives, polyaniline derivatives and organic acid, polythiophene derivatives and polymer acid. In particular, a mixture of polyethelenedioxithiophene and polystyrene-sulfonic-acid (PEDOT/PSS) is preferable.

The light emitting layer 11 is configured including a light emitting material having a cross-linking group such as epoxy group. As such a light emitting material, polyfluorene derivatives (PF; e.g., F8BT), polyparaphenylenevinylene derivatives (PPV), polyphenylene derivatives (PP), polyparaphenylene derivatives (PPP), polyvinylcarbazole (PVK) polythiophene derivatives, and a polycilane based material such as polymethylphenylsilane (PMPS) which are known polymeric light emitting material capable of fluorescent emission or phosphorescent emission, can preferably be used.

As a material of the electron transport layer 12, a polymeric organic material such as polyfluorene derivatives, polyparaphenilenevinylene derivatives, polyparaphenilene derivatives, polyvinylcarbazole, polythiophene derivatives, or a polycilane based material such as polymethylphenylsilane can preferably be used. Each of such a hole injection layer 10, a light emitting layer 11, an electron transport layer 12 can be formed by coating the above materials by a wet process such as a spin coat method or an inkjet process.

Further, the common electrode 13 is formed of a thin film of, for example, a magnesium-gold alloy (in mole ratio, Mg:Au=1:2).

On the other hand, the cathode 6 of the electrolytic element 4 is formed of a platinum thin film formed by an evaporation method.

As the material of the solid-state electrolyte layer 5, Nafion (registered trademark, a product of DuPont) can be used, and the solid-state electrolyte layer 5 can be formed by coating the dispersion liquid of Nafion by a spin coat process. Nafion is perfluorosulfonic acid/PTFE copolymer, which can generally be expressed by a chemical formula [Chemical Formula 1] described below. It includes a sulfonic acid group, and has the hydrogen composing a large molecule polymer be substituted with fluorine. Perfluoropolymer such as Nafion has a higher chemical stability. It is thought to be stabilized because abstraction of hydrogen caused by generation of hydroperoxy radical.

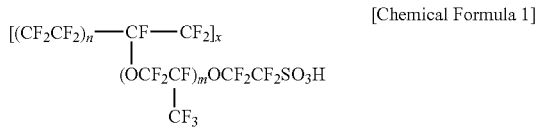

[Chemical Formula 1]

Alternatively, as other organic materials than Nafion, poly (bis(4-sulfophenoxy)phosphazene) ([Chemical Formula 2] described below), poly[(vinylchloride-co-(1 methyl-4-vinylpiperazine)) ([Chemical Formula 3] described below), poly(2-vinylpyridine-co-styrene), Average Mw 220,000 by LS, Average Mn 130,000, granular ([Chemical Formula 4] described below), and so on can also be used. Alternatively, polystyrene-sulfonic-acid used as ion-exchange resin can be used. Although it is inferior in stability to perfluoropolymer, even a hydrocarbon material inferior in stability can be used for electrolysis of a small amount of penetrating water.

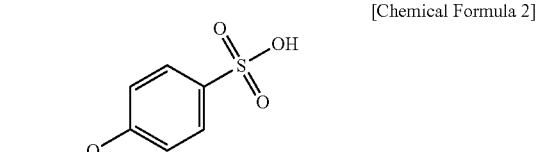

[Chemical Formula 2]

[Chemical Formula 3]

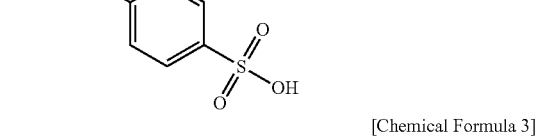

[Chemical Formula 4]

Further, as an inorganic material, silver iodide, $Li_2Ti_3O_7$, β-alumina, $RbAg_4I_5$, phosphotungstic acid, and so on can be used.

Further, similar to the cathode 6, the anode 7 of the electrolytic element 4 is formed of a platinum thin film formed by an evaporation method. Further, it is preferable that the anode 7 is provided with holes or grooves (gas-permeable holes) so small that oxygen gas marginally passes therethrough. In that sense, a conductive graphite sheet as a porous material, for example, can also be used. Further, epoxy resin is used as the sealing layer 8. Alternatively, the sealing layer 8 can also be formed by laminating the glass substrate 2 with a film made of polytrifluoroethylene or the like. In the present embodiment, since both of the cathode 6 and the anode 7 of the electrolytic element 4 are made of platinum, the electrolytic reaction can be made more effectively progress by the catalytic action of platinum. In the case in which a conductive graphite sheet is used, it becomes possible to reduce the cost of the electrode while enhancing the gas permeability by holding the platinum fine particles on the surface of the graphite, thus obtaining effective electrolytic reaction.

When using the organic EL device 1 having the configuration described above, a voltage of no lower than 1.2V and no higher than 50V (preferably no higher than 10V; the electrolysis does not start unless the voltage is at least no lower than 1.2V) has previously been applied between the cathode 6 and the anode 7 of the electrolytic element 4. In this case, if moisture penetrates inside the sealing layer 8, and is absorbed by the solid-state electrolyte layer 5, the moisture is ionized into $H^+$ ($H_3O^+$) and $OH^-$, respectively. Then, the $H^+$ ($H_3O^+$) ions and the $OH^-$ ions diffuse towards the side of the cathode 6 and the side of the anode 7, respectively, and form hydrogen gas and oxygen gas on the respective electrodes. These gases are gradually discharged outside the device, and will never have densities greater than a certain value.

In the organic EL device 1 according to the present embodiment, since the electrolytic element 4 is sealed inside the sealing layer 8 together with the organic EL element 3, even if moisture penetrates inside the sealing layer 8, the moisture is decomposed by the electrolytic element 4, and converted into oxygen gas and hydrogen gas. According to this action, since the moisture concentration inside the device can be held down to prevent degradation of performance of the organic EL element 3 by the moisture, the organic EL device superior in reliability can be realized. In particular, by keeping the voltage applied between the cathode 6 and the anode 7 of the electrolytic element 4, the moisture concentration inside the device can be kept low. Alternatively, in the case in which the voltage is applied only intermittently, if the moisture permeability of the sealing layer 8 is sufficiently low, it is possible to control the moisture concentration to be kept in a low condition for a long period of time. In general, deterioration of an organic EL device is particularly accelerated in the case in which the organic EL is powered in the presence of moisture. From this point of view, it is preferable that the voltage is applied between the electrodes 6, 7 of the electrolytic element 4 at least when the organic EL element is in operation.

In the case of the present embodiment, since the organic EL element 3 and the electrolytic element 4 are stacked on the same side of the glass substrate 2, downsizing of organic electronic devices can be achieved while maintaining high reliability. In this case, since the cathode 6 of the electrolytic element 4 is disposed facing to the side of the organic EL element 3, and the anode 7 thereof is disposed facing to the opposite side, the deterioration of the organic EL element 3 caused by the oxygen gas generated on the anode 7 can also be prevented. Therefore, it is preferable that the anode 7 is provided with the gas-permeable holes and accordingly high oxygen permeability.

Second Embodiment

Hereinafter, a second embodiment of the invention will be described with reference to FIG. 3.

An organic electronic device of the present embodiment is an example of an organic EL device having an organic EL element as a functional element and an electrolytic element disposed in parallel to each other on a substrate.

Figure 3:
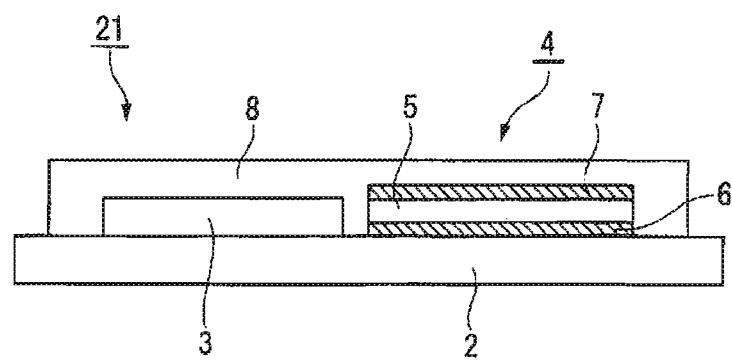
FIG. 3 is a cross-sectional view of an organic EL device (an electronic device) according to a second embodiment.

FIG. 3 is a cross-sectional view of the organic EL device according to the present embodiment. Further, in FIG. 3, the elements common to those shown in FIG. 1 are provided with the same reference numerals, and detailed explanations therefor are omitted.

As shown in FIG. 3, the organic EL device 21 according to the present embodiment provided with an organic EL element 3 formed on one surface of a glass substrate 2, and an electrolytic element 4 formed adjacent to the organic EL element 3. The cathode 6 of the electrolytic element 4 is disposed on the side of the glass substrate 2, and the anode 7 thereof is disposed on the side opposite to the glass substrate 2. Further, the organic EL element 3 and the electrolytic element 4 are integrally sealed by a sealing layer 8 formed on the one surface side of the glass layer 2.

The inside configuration of the organic EL element 21 is common to the first embodiment, and detailed explanations therefor will be omitted, but has a slight difference in the composing material. As the hole injection layer 10 shown in FIG. 2, an NPB thin film is formed by an evaporation process. Further, as the light emitting layer 11 on the hole injection layer 10, Alq3 (aluminum chelate complex) thin film is formed using an evaporation method. Further, the electrolytic element 4 includes sheets each formed as one of the cathode 6 and anode 7 by evaporating platinum thin films on both sides of a Nafion 115 sheet disposed on the glass substrate 2 instead of the configuration of the first embodiment having the cathode 6, the solid-state electrolyte layer 5, and the anode 7 stacked in sequence. Further, the sealing layer 8 is formed by laminating the glass substrate 2 with a film made of polytrifluoroethylene or the like.

Also in the organic EL device 21 according to the present embodiment, since the deterioration of the performance of the organic EL element 3 caused by moisture can be prevented, a similar advantage to the advantage of the first embodiment that the organic EL device superior in reliability can be realized can be obtained.

Third Embodiment

Hereinafter, a third embodiment of the invention will be described with reference to FIGS. 4 through 6.

An organic electronic device according to the present embodiment is an example of an electrophoretic display device having an organic TFT as a functional element and an electrophoretic element driven by the organic TFT both formed on one surface of the substrate and the electrolytic element formed on the other surface thereof respectively.

Figure 4:
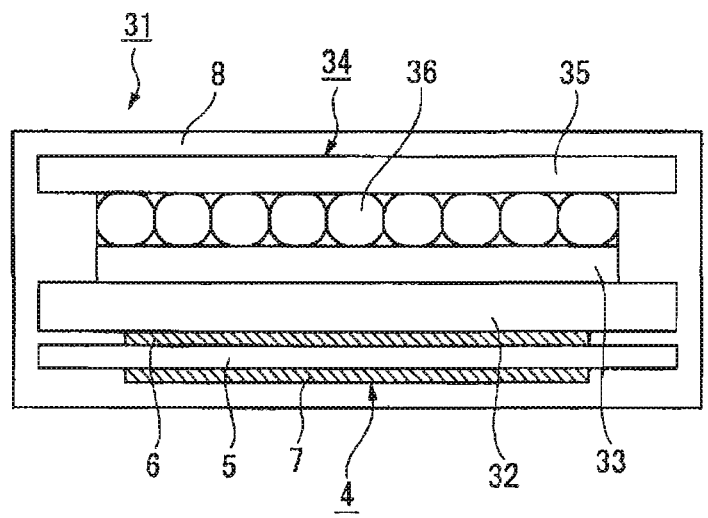
FIG. 4 is a cross-sectional view of an electrophoretic display device (an electronic device) according to a third embodiment.
Figure 5:
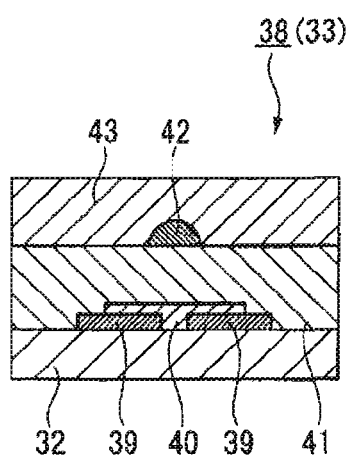
FIG. 5 is a cross-sectional view showing a detailed configuration of an organic TFT used for the device according to the same.
Figure 6:
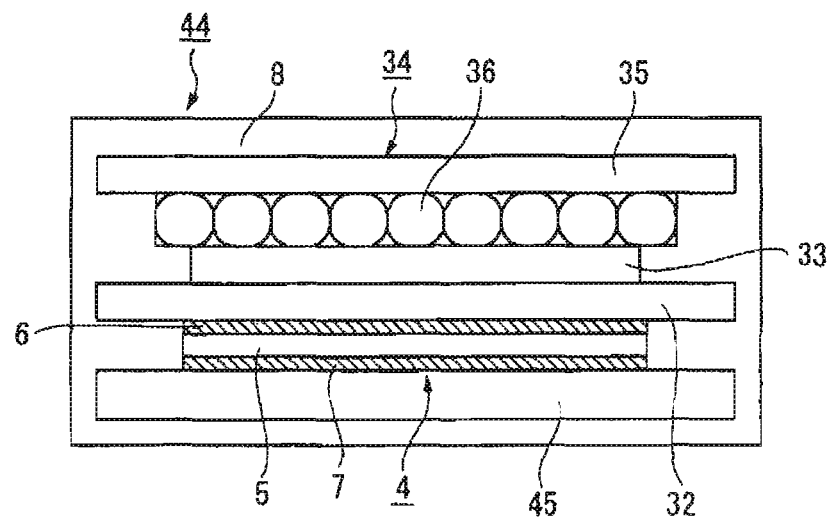
FIG. 6 is a cross-sectional view of a modified example of the electrophoretic display device according to the third embodiment.

FIG. 4 is a cross-sectional view of the electrophoretic display device according to the present embodiment, FIG. 5 is a cross-sectional view only showing a part of the organic TFT, and FIG. 6 is a cross-sectional view of a modified example of the electrophoretic display device of the same. Further, in FIGS. 4 through 6, the elements common to those shown in FIG. 1 are provided with the same reference numerals, and detailed explanations therefor are omitted.

As shown in FIG. 4, the electrophoretic display device 31 of the present embodiment is provided with an active matrix circuit 33 with organic TFT formed on one surface of an organic TFT support substrate 32 formed of a well known plastic substrate such as polycarbonate or polyethylene terephthalate, and an electrophoretic element 34 driven by the active matrix circuit 33 formed thereon. The electrophoretic element 34 is configured by, for example, disposing a number of microcapsules 36 encapsulating electrophoretic particles on a display element substrate 35 formed of a similar plastic substrate to the plastic substrate described above. Further, the form is taken in which the side of the electrophoretic element 34 to which the microcapsules 36 are provided is bonded on the active matrix circuit 33. Further, on the opposite side of the organic TFT support substrate 32, there is provided the electrolytic element 4, and the whole structure is sealed by the sealing layer 8.

As shown in FIG. 5, the organic TFT 38 is a switching element formed mainly using a solution process, and a transistor of a so-called top-gate structure in which a source electrode and a drain electrode 39, an organic semiconductor layer 40, an insulating layer 41, and a gate electrode 42 stacked in sequence from the side of the organic TFT support substrate 32. Further, pixel electrodes (not shown) are provided corresponding to the organic TFT 38, and are electrically connected to the drain electrodes 39, respectively, via contact holes (not shown). It should be noted that although the top-gate structure is explained in the present embodiment, the structure is not a limitation, but the bottom-gate structure can also be adopted.

Further specifically, an adhesive layer (not shown) made of chromium or titanium is formed on the organic TFT support substrate 32, after then, a gold thin film is patterned using a photolithography method, thus forming the source electrode and the drain electrode 39. Further, the organic semiconductor layer 40 made of a material such as F8T2 (fluorenebithiophene copolymer) is formed so as to cover the channel section using an inkjet method. Then, the insulating layer 41 made of polystyrene (PS) or polymethylmethacrylate (PMMA) is formed as a film so as to cover the organic semiconductor layer 40 using an inkjet method or a spin coat method, and further, an Ag colloidal liquid is printed thereon, thus forming the gate electrode 42. Further, a water-soluble polymer film such as PVA is formed as a film on the entire surface using a spin coat method, thus a passivation layer 43 is formed. The electrophoretic element 34 separately manufactured is bonded on the active matrix circuit 33 thus formed with the side of the microcapsule 36 facing to the side of the active matrix circuit 33.

Meanwhile, the electrolytic element 4 with the cathode 6, anode 7 respectively formed by evaporating the platinum thin film on the both surfaces of the solid-state electrolyte layer 5 formed of the Nafion 115 sheet is manufactured in a separate process. Further, by overlapping the electrolytic element 4 on the surface of the organic TFT support substrate 32 opposite to the side of the active matrix circuit 33, and then holding them with films made of polytrifluoroethylene or the like to form a laminated sealing, the sealing layer 8 is formed.

Also in the electrophoretic display device 31 according to the present embodiment, since the deterioration of the performance of the organic TFT 38 caused by moisture can be prevented, a similar advantage to the advantage of the first and the second embodiments that the electrophoretic display device superior in reliability can be realized can be obtained. Similarly to the case with the organic EL device, since the deterioration of the organic TFT 38 is also accelerated in the case in which the organic TFT 38 is powered in the presence of moisture, it is preferable that the voltage is kept applied between the electrodes 6, 7 of the electrolytic element 4 at least when the organic TFT 38 is in operation. Further, in the case of the present embodiment, since the plastic material is used for all of the organic TFT support substrate 32, the display element substrate 35, and the sealing layer 8, the flexible display device with high reliability while adopting a simple sealing structure can be realized.

It should be noted that as shown in FIG. 6, it is possible to adopt the configuration that the electrolytic element 4 is previously formed on an electrolytic element support substrate 45 and then bonded with the organic TFT support substrate 32.

It is also possible to widely use any known organic semiconductors as the organic semiconductor in addition to F8T2. For example, small molecule organic semiconductor materials such as naphthalene, anthracene, tetracene, pentacene, hexacene, phthalocyanine, perylene, hydrazone, triphenyl-methane, diphenylmethane, stilbene, arylvinyl, pyrazoline, triphenylamine, triarylamine, phthalocyanine, or derivatives of the above, or polymeric semiconductor materials such as poly-N-vinvlcarbazole, polyvinylpyrene, polyvinylan-thracene, polythiophene, polyhexylthiophene, poly(p-phe-nylenevinylene), polythenylenevinylene, polyarylamine, pyrene-formaldehyde resin, ehtylcarbazole-formaldehyde resin, fluorene-bithiophene copolymer, fluorene-arylamine copolymer, or derivatives of the above can be cited, and these materials can be used alone or in combination. Alternatively, oligomer including thiophene, triphenylamine, naphthalene, perylene, fluorene, or the like can also be used.

It is especially effective to use the organic semiconductor functioning as a p-type channel layer out of the above mentioned organic semiconductors. P-type organic semiconductors are more stable against oxygen compared to n-type organic semiconductors. Therefore, since the electrolytic element 4 according to the embodiment of the invention is hardly influenced by the generated oxygen, the effect that the moisture is removed by the electrolytic element 4 is effectively exerted. In other words, since the p-type organic semiconductors are influenced by water but only slightly influenced by oxygen, an element with high reliability can be realized only by removing water from the atmospheric air penetrating the element. In the p-type organic semiconductors, those with ionization potential of 4.7 eV or higher are hardly influenced by oxygen, and accordingly effective as the organic semiconductor according to the embodiment of the invention.

Further, in the present embodiment, the gate electrode is formed by printing the Ag colloidal liquid. By annealing the Ag colloid thus printed at a low temperature (e.g., 120° C. or lower), high conductivity can be obtained. The Ag colloid is a quite useful material for forming a highly conductive electrode on a plastic. On the other hand, Ag can easily be ionized in the presence of water, and if the voltage is applied thereto, the Ag ions are migrated to problematically cause a short between the electrodes. Therefore, by removing water inside the element with the configuration of the embodiment of the invention, highly reliable electrodes and wiring can be formed even on a plastic. Accordingly, it is particularly effective to use electrodes and wiring formed by printing the colloid dispersing Ag or thin film transistors including such electrodes and wiring to the embodiment of the invention.

Fourth Embodiment

Hereinafter, a fourth embodiment of the invention will be described with reference to FIG. 7.

The electronic device according to the present embodiment is an example of an electrophoretic display device having the electrophoretic element and the electrolytic element stacked on the same substrate.

Figure 7:
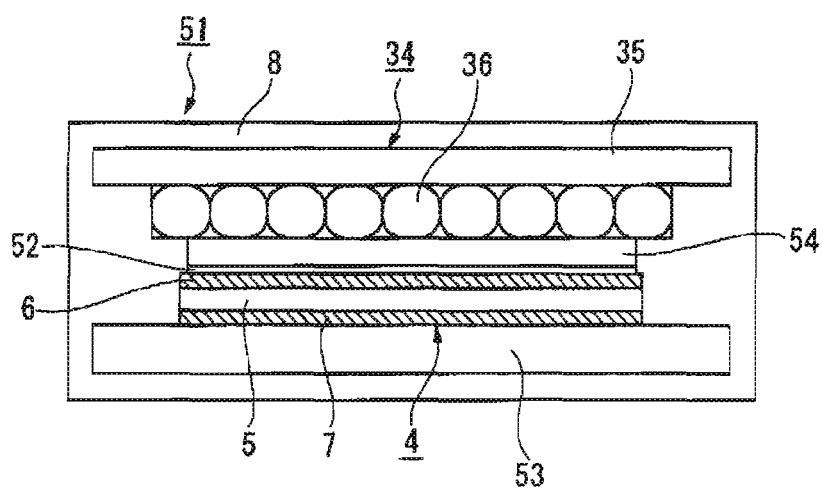
FIG. 7 is a cross-sectional view of an electrophoretic display device (an electronic device) according to a fourth embodiment.

FIG. 7 is a cross-sectional view of the electrophoretic display device according to the present embodiment. Further, in FIG. 7, the elements common to those shown in FIGS. 4 and 6 are provided with the same reference numerals, and detailed explanations therefor are omitted.

As shown in FIG. 7, an electrophoretic display device 51 according to the present embodiment is provided with the electrolytic element 4 disposed on one surface of a oxide thin film transistor (oxide TFT) support substrate 53 formed of a well known plastic substrate such as polycarbonate or polyethylene terephthalate, an active matrix circuit 54 including oxide TFT and formed on the electrolytic element 4, and the electrophoretic element 34 formed on the active matrix circuit 54. The electrophoretic element 34 is formed by disposing the microcapsules 36 encapsulating the electrophoretic particles on the display element substrate 35, and has a form in which the side provided with the microcapsules 36 is bonded on the active matrix circuit 54.

The anode 7 is formed by evaporating the platinum thin film on the oxide TFT support substrate 53, the solid-state electrolyte layer 5 is formed by applying the Nafion dispersion liquid thereon using a spin coat method, and the cathode 6 is formed by evaporating the platinum thin film thereon again. Further, insulator copolymer such as epoxy resin or polyester resin is applied thereon using a spin coat method, and then cured to be insolubilized, thus forming a foundation layer 52. The active matrix circuit 54 is manufactured by forming oxide TFT on the foundation layer 52, the electrophoretic element 34 is bonded with the active matrix circuit 54 with the side of the microcapsules 36 facing to the side of the active matrix circuit 54. The succeeding process of forming the oxide TFT is well known, and accordingly the explanations will be omitted.

Also in the electrophoretic display device 51 according to the present embodiment, since the deterioration of the performance of the oxide TFT caused by moisture can be prevented, a similar advantage to the advantage of the third embodiment that the electrophoretic display device superior in reliability can be realized can be obtained. In particular in the case of the present embodiment, since the active matrix circuit having oxide TFT is stacked directly on the electrolytic element 4, effectiveness of preventing deterioration of performance caused by moisture can further be enhanced. This is because oxide semiconductors are highly hygroscopic in general, and accordingly easily influenced by moisture. As the name suggests, the oxide semiconductors are hardly influenced by oxygen, and accordingly, the embodiment of the invention is especially advantageous.

As the oxide semiconductor, $ZnO$, $NiO$, $SnO_2$, $TiO_2$, $In_2O_5$, $V_2O_5$, $SrTiO_3$, $WO_2$, amorphous In—Ga—Zn—O (a-IGZO), amorphous Cd—Ge—O, and amorphous Cd—Pb—O can be used by forming as a thin film using an evaporation method, a sputtering method, a sol-gel method and so on.

It should be noted that the scope of the invention is not limited to the embodiments described above, but various modifications can be executed thereon within the range of the scope or the spirit of the invention. For example, the specific configurations, materials, manufacturing methods and so on of the organic EL element, organic TFT exemplified as a functional element in the embodiments described above can be modified according to needs. Further, although the element according to the embodiment of the invention is especially advantageous for organic functional devices easily influenced by moisture, it is not limited to the organic functional devices. For example, it is also advantageous for an electroluminescence element or a thin film transistor using an oxide semiconductor. Further, it is also advantageous to apply the present structure to solar cells using an organic semiconductor or an oxide semiconductor.

What is claimed is:

1. An electrophoretic device comprising:
 a substrate including:
  a first side; and
  a second side opposite to the first side;
 an electrophoretic element including electrophoretic particles, the electrophoretic element being disposed on the first side of the substrate;
 an electrolytic element disposed on the second side of the substrate, the electrolytic element having an overlap with the electrophoretic element in plan view, the electrolytic element being capable of applying electrolysis to water, and the electrolytic element including:
  a solid-state electrolyte layer; and
  a pair of electrodes configured to hold the solid-state electrolyte layer in between; and
 a sealing member configured to seal the electrophoretic element and the electrolytic element, the electrolytic element and the electrophoretic element being disposed between the sealing member and the substrate.

2. The electrophoretic device according to claim 1, wherein out of the pair of electrodes forming the electrolytic element, a cathode is disposed facing to the electrophoretic element side, and an anode is disposed facing to a side opposite the electrophoretic element side.

3. The electrophoretic device according to claim 2, wherein the anode is provided with a gas-permeable hole.

4. The electrophoretic device according to claim 1, wherein an active matrix circuit is formed between the electrophoretic element and the substrate, the active matrix circuit including a thin film transistor.

5. The electrophoretic device according to claim 4, wherein the thin film transistor includes an organic material layer.

6. The electrophoretic device according to claim 4, wherein the thin film transistor includes an oxide semiconductor layer.

7. The electrophoretic device according to claim 1, wherein the substrate and the sealing member are formed of a resin material.

8. The electrophoretic device according to claim 1, wherein the solid-state electrolyte layer is formed of a polymeric electrolyte material.

9. The electrophoretic device according to claim 8, wherein the polymeric electrolyte material includes a sulfonic acid group.

10. The electrophoretic device according to claim 8, wherein at least a part of hydrogen composing the polymeric electrolyte material is substituted by fluorine.

11. The electrophoretic device according to claim 1, wherein a material of the pair of electrodes forming the electrolytic element includes one of platinum and palladium.

12. An electrophoretic device comprising:
 an electrophoretic element including electrophoretic particles;
 an electrolytic element having an overlap with the electrophoretic element in plan view, the electrolytic element being capable of applying electrolysis to water, and the electrolytic element including:
  a solid-state electrolyte layer; and
  a pair of electrodes configured to hold the solid-state electrolyte layer in between;
 an underlying layer disposed between the electrophoretic element and the electrolytic element; and
 an active matrix circuit being formed between the electrophoretic element and the underlying layer, the active matrix circuit including a thin film transistor.

* * * * *